(12) United States Patent
Lof

(10) Patent No.: US 7,292,339 B2
(45) Date of Patent: Nov. 6, 2007

(54) ALIGNMENT METHOD AND APPARATUS, LITHOGRAPHIC APPARATUS, DEVICE MANUFACTURING METHOD, AND ALIGNMENT TOOL

(75) Inventor: Joeri Lof, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 466 days.

(21) Appl. No.: 10/887,311

(22) Filed: Jul. 9, 2004

(65) Prior Publication Data

US 2006/0007441 A1    Jan. 12, 2006

(51) Int. Cl.
*G01B 11/00* (2006.01)
(52) U.S. Cl. .................................................. 356/401
(58) Field of Classification Search ........ 356/399–402; 355/53, 43; 250/548
See application file for complete search history.

(56) References Cited

U.S. PATENT DOCUMENTS

| | | | |
|---|---|---|---|
| 5,843,831 A | 12/1998 | Chung et al. | |
| 6,376,329 B1 * | 4/2002 | Sogard et al. | 438/401 |
| 6,525,805 B2 | 2/2003 | Heinle | 355/53 |
| 6,768,539 B2 | 7/2004 | Gui et al. | 355/53 |
| 6,936,385 B2 | 8/2005 | Lof et al. | |
| 7,130,049 B2 * | 10/2006 | Consolini et al. | 356/399 |
| 2002/0109825 A1 * | 8/2002 | Gui et al. | 355/53 |
| 2002/0167649 A1 | 11/2002 | Heinle | |
| 2003/0194176 A1 * | 10/2003 | Townsend et al. | 385/25 |

FOREIGN PATENT DOCUMENTS

| | | |
|---|---|---|
| EP | 1 406 126 A | 4/2004 |
| JP | 11-340120 A | 12/1999 |

OTHER PUBLICATIONS

European Search Report dated Nov. 29, 2005.

* cited by examiner

*Primary Examiner*—Tarifur Chowdhury
*Assistant Examiner*—Isiaka O Akanbi
(74) *Attorney, Agent, or Firm*—Pillsbury Winthrop Shaw Pittman LLP

(57) ABSTRACT

In one embodiment, front to back side alignment optics are used to project a mark on the back side of a substrate. The front to back side alignment optics are arranged such that the image projected into the image window of the front to back side alignment optics is a translational replica of the mark on the back side of the substrate. One potential advantage of such an arrangement is that any slight inaccuracies in the location of the optical axis do not result in inaccuracies in the image of the substrate mark. The translational replica image can be used for alignment of the substrate.

23 Claims, 3 Drawing Sheets

ALIGNMENT METHOD AND APPARATUS, LITHOGRAPHIC APPARATUS, DEVICE MANUFACTURING METHOD, AND ALIGNMENT TOOL

FIELD OF THE INVENTION

The present invention relates to alignment apparatus and methods, especially as applied to lithography.

BACKGROUND INFORMATION

A lithographic apparatus is a machine that may be used to apply a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning structure" used herein should be broadly interpreted as referring to structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning structure may be transmissive or reflective. Examples of patterning structure include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning structure, the support structure may be a frame or table, for example, which may be fixed or movable as required and which may ensure that the patterning structure is at a desired position, for example with respect to the projection system. Any use of the terms "reticle" or "mask" herein may be considered synonymous with the more general term "patterning structure."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

It may be desired to correctly align the substrate before exposing it, e.g. to ensure accurate projection of the functional features. Conventionally this is achieved using the apparatus shown in FIG. 2. Complimentary alignment marks $M_1$, $M_2$, and substrate marks $P_1$, $P_2$ are present on a mask and substrate respectively and an alignment system is used to detect alignment. Examples of alignment systems are a conventional through the lens alignment system and also the alignment method and apparatus described in co-pending European Patent Application Nos. 02251440 and 02250235. A mark is commonly on the front side of the substrate, but could also be on the back side of the substrate. Marks on the back side of the substrate are used, for example, when exposure is to take place on both sides of the substrate. This occurs particularly in the manufacture of micro electromechanical systems (MEMS) or micro opto-electromechanical systems (MOEMS). When the substrate marks $P_1$ and $P_2$ are on the back surface of the substrate they are re-imaged by front to back side alignment optics 22 at the side of the substrate W to form an image $P_i$ as shown for $P_2$ in FIG. 2 ($P_1$ would be re-imaged by another branch of the front to back side alignment optics) of the accompanying drawings. The front to back side alignment optics, together with the alignment system AS are used to determine the relative position of marks on the front side of the substrate to marks on the back side of the substrate. This enables functional features exposed on the front side of the substrate to be correctly lined up with functional features exposed on the back side of the substrate.

Using conventional front to back side alignment optics a mirror image of the substrate mark is projected into the image window of the front to back side alignment optics. This mirror image is the image used for alignment described above and therefore its position relative to the actual position of the substrate mark must be accurately known. In particular, the optical axis of the front to the back side alignment optics around which the mirror image is flipped must be accurately known. Any error in the optical axis will result in twice the error in the measurement of the substrate position.

Furthermore, due to the mirroring in the optics the rotation of the image of a mark on the back side of the substrate is opposite to the rotation of the front side of the substrate. This can lead to problems during fine alignment if not taken into account.

SUMMARY

An alignment method according to one embodiment comprises providing a substrate having a substrate mark on the back side of said substrate; forming an image of said substrate mark; and providing an alignment system for detecting alignment between a reference mark and said image of said substrate mark using an alignment beam, wherein said image of said mark is a translational replica of said substrate mark.

A device manufacturing method according to an embodiment comprises an alignment method as described herein; providing a projection beam of radiation using an illumination system; using patterning structure to impart the projection beam with a pattern in its cross section; and projecting the patterned beam of radiation onto a target portion of the substrate.

An alignment tool according to an embodiment comprises a substrate table configured to hold a substrate having a substrate mark; an alignment system configured to detect alignment between a reference mark and an image of said substrate mark when said substrate mark is on the back side of said substrate using an alignment beam of radiation; and optics configured to project a translational replica of said substrate mark arranged on the back side of said substrate to form said image.

A lithographic apparatus according to an embodiment comprises an illumination system configured to provide a projection beam of radiation; a support structure configured to support patterning structure, the patterning structure serving to impart the projection beam with a pattern in its cross-section; a substrate table configured to hold a substrate having a substrate mark; a projection system configured to project the patterned beam onto a target portion of the substrate; and optics configured to project a translational replica of said substrate mark when said substrate mark is arranged on the back side of said substrate.

An alignment tool according to another embodiment comprises a substrate table configured to hold a substrate having a substrate mark; an alignment system configured to detect alignment between a reference mark and a substrate mark when said substrate mark is on the back side of said substrate, using an alignment beam of radiation; and an optical system which allows optical communication between said alignment system and said substrate mark, wherein said optical system has a net mirroring effect of zero, such that said alignment system detects said substrate mark with an unchanged orientation.

An alignment tool according to another embodiment comprises a substrate table configured to hold a substrate having a substrate mark; an alignment system configured to detect alignment between a reference mark and an image of said substrate mark when said substrate mark is on the back side of said substrate, using an alignment beam of radiation; and optics configured to project said substrate mark arranged on the back side of said substrate to form said image, said optics having a net mirroring effect of zero, such that said alignment system is configured to detect said image of said substrate mark with an unchanged orientation relative to said substrate mark.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Embodiments of the present invention include alignment methods in which inaccuracies due to optical axis rotation are minimised.

Figure 1:
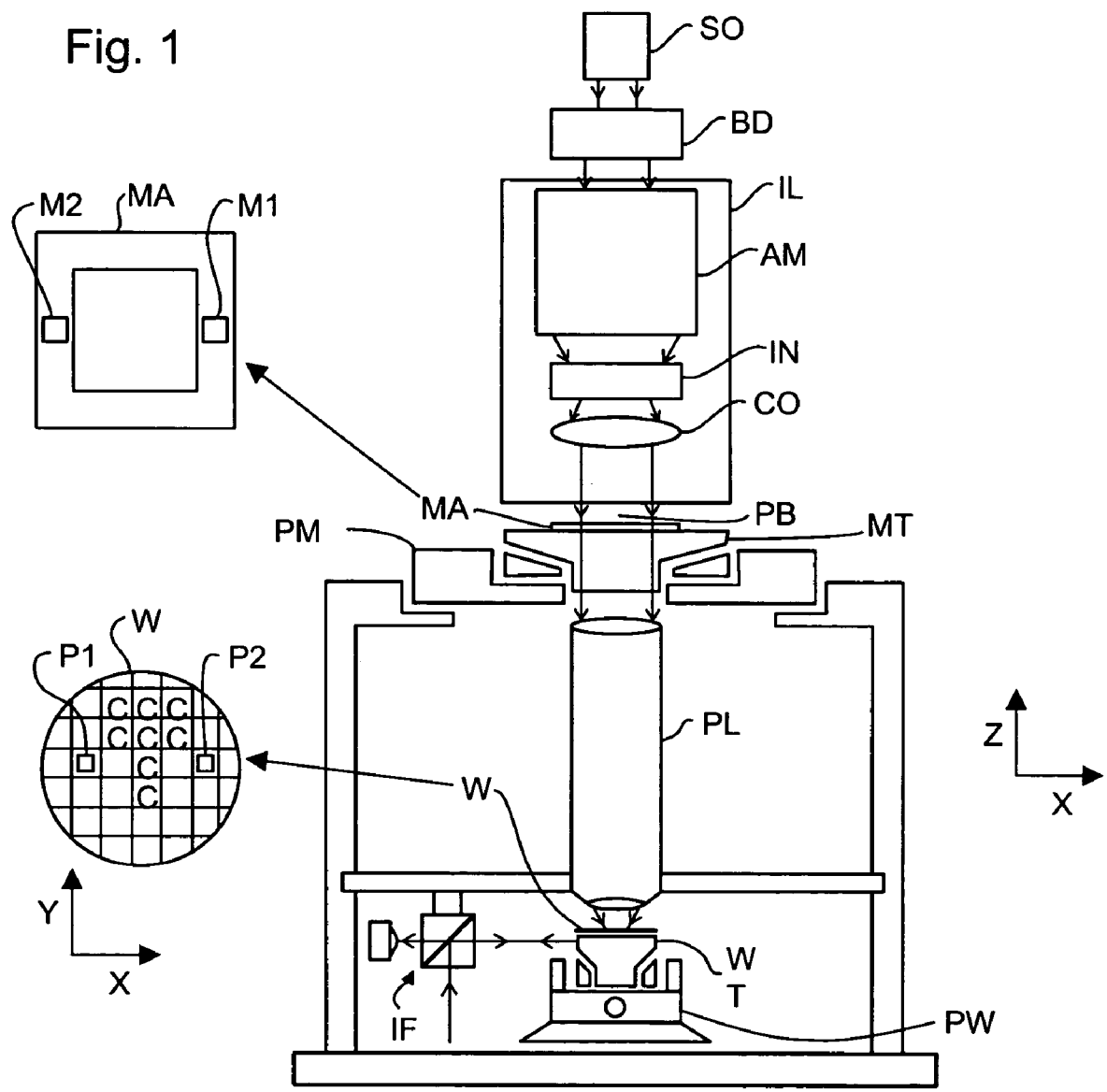
FIG. 1 depicts a lithographic apparatus according to an embodiment of the invention.
Figure 2:
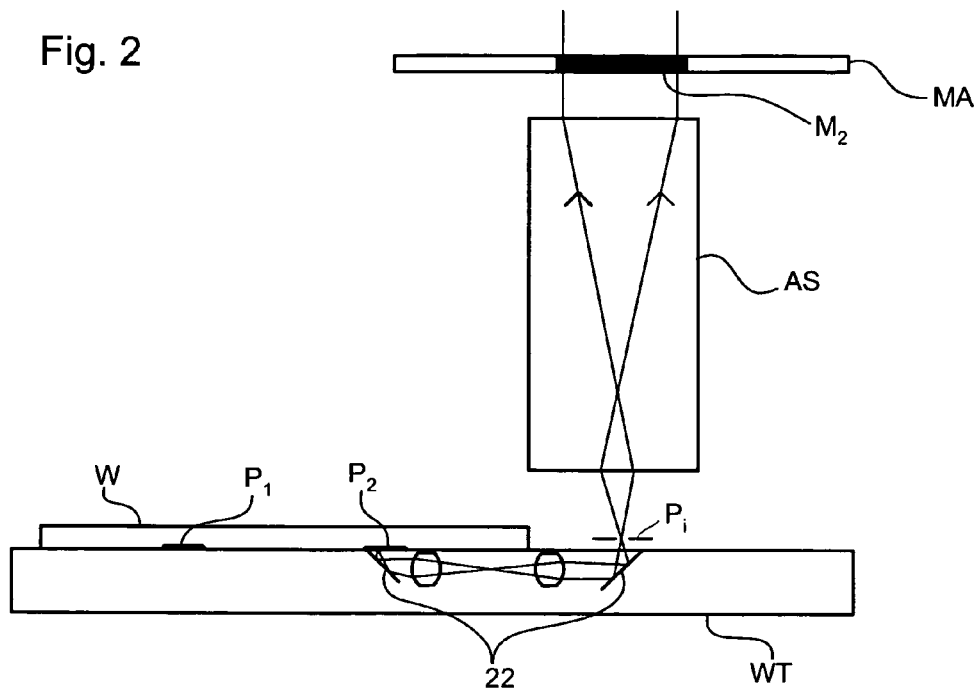
FIG. 2 depicts a front to back side alignment apparatus.

FIG. 1 schematically depicts a lithographic apparatus according to a particular embodiment of the invention. The apparatus comprises:

an illumination system (illuminator) IL configured to provide a projection beam PB of radiation (e.g. UV radiation or e.g. UV radiation).

a first support structure (e.g. a mask table) MT configured to support patterning structure (e.g. a mask) MA and connected to a first positioning device PM configured to accurately position the patterning structure with respect to item PL;

a substrate table (e.g. a wafer table) WT configured to hold a substrate (e.g. a resist-coated wafer) W and connected to a second positioning device PW configured to accurately position the substrate with respect to item PL; and a projection system (e.g. a refractive projection lens) PL configured to image a pattern imparted to the projection beam PB by patterning structure MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL is configured to receive a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may comprise adjusting structure AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

In step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 3A:
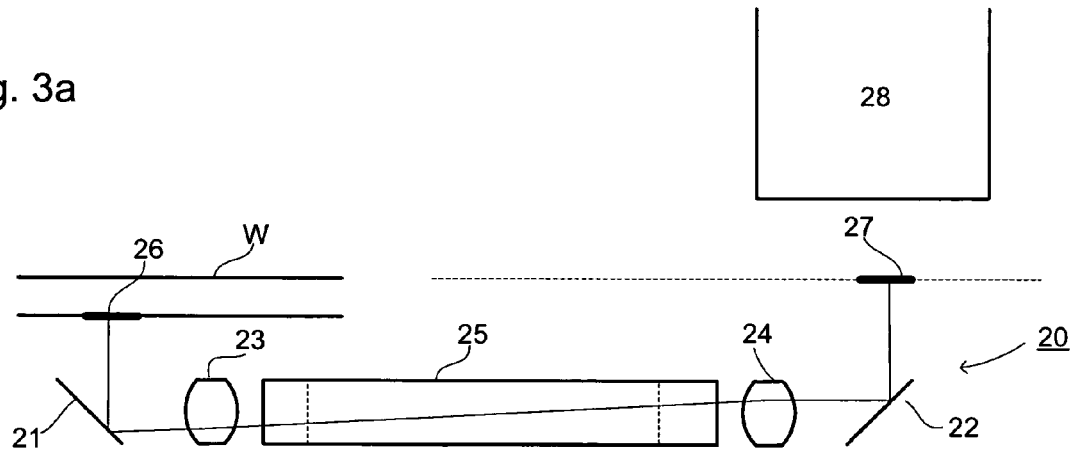
FIG. 3a depicts a first embodiment shown in the YZ plane.

The lithographic apparatus further comprises front to back side alignment optics 20 as shown in FIG. 3a. The front to back side alignment optics comprise mirrors 21, 22 arranged at 45° to the surface of the substrate to direct a radiation beam along the front to back side alignment optics. Front to back side alignment optics 20 also comprise optical elements 23 and 24 which in this example are lens elements having a combined mirroring effect. However, any optical elements capable of focusing and projecting an image of the substrate mark $P_1$ and having a mirroring effect could be used.

Figure 3B:
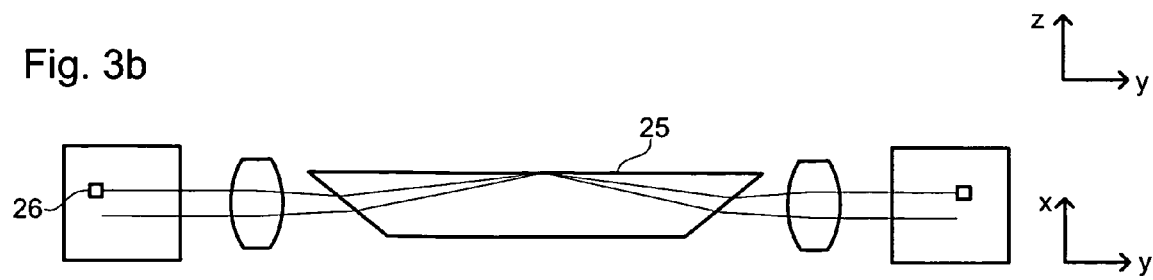
FIG. 3b depicts the first embodiment shown in XY plane.

Front to back side alignment optics 20 also comprise a prism 25. As can be seen from FIG. 3b the alignment beam enters the prism at an angle of approximately 45°. The alignment beam is then reflected from another surface and is transmitted from the prism 25 at an angle of approximately 45°. As can be seen from FIG. 3b the surface from which the alignment beam is reflected is perpendicular to the substrate table and substantially parallel to the overall direction of propagation of the alignment beam. The prism 25 therefore has a mirroring effect and a translational replica image 27 is formed near substrate W. Again, other optical elements having a mirroring effect may be used, but a prism has been found to be particularly suitable.

The substrate W has a mark 26 which has mirror symmetry. The substrate W is initially positioned with the substrate mark 26 on the front side i.e. facing the projection system PL. An alignment apparatus 28 is then used to detect the exact location of the substrate W (e.g. within a measurement error) and the exposure of the front side of the substrate W then occurs. The substrate W is then turned over and arranged such that the substrate mark 26 is in the object window of the front to back side alignment optics. An image of the substrate mark 26 is projected through front to back side alignment optics and into the image window of the front to back side alignment optics. Alignment system 28 detects the image of the substrate mark 26. As the image to object vector is known the location of the substrate mark is known and exposure of the other side of the substrate (i.e. the side of the substrate on the front side—now facing the projection system PL) occurs. In such manner, the functional features exposed on one side of the substrate W are may be accurately aligned with the functional features on the other side of the substrate.

In the particular example above, the same alignment system 28 is used to detect the location of the same substrate mark when it is on both the front and back sides of the substrate. However, if the substrate mark 26 does not have mirror symmetry the alignment system 28 may not be able to detect the substrate mark 26 when it is on both the front and back side of the substrate, as the image of substrate mark 26 displayed in the image window of the front to back side alignment optics 20 is a mirror image of the substrate mark when it is on the front side of the substrate (the mirror symmetry results from the substrate being flipped over).

There may therefore be a second substrate mark at a known displacement from the first substrate mark 26. The second substrate mark would be a mirror image of the first substrate mark. One of the substrate marks would therefore be used when aligning to the front side of the substrate and the other when aligning to the back side of the substrate. Alternatively, different alignment systems may be used for the two alignments or the same alignment, but using different reticles for the two alignments. However, such solutions may be cumbersome and may introduce additional errors.

Although the example used here is of a separate alignment system 28, the alignment system may be a through-the-lens type alignment system and thus comprise part of the projection system PL.

An embodiment as described herein may be implemented such that the accuracy of the alignment is no longer dependent on the accuracy with which the optical axis is known. Such an implementation can also improve substrate throughput, e.g. by avoiding a need to align the substrate table to the reticle comprising the reference mark to determine the exact location of the optical axis. The reticle can simply be aligned to the substrate. However, it may be desirable or necessary to know the approximate location of the optics used to project the translational image, e.g. to implement any correction factors.

The term translational replica is not intended to imply that the image of the substrate mark is the same size as the substrate mark, as some magnification or de-magnification of the image may occur. Instead, the term translational replica should be understood to mean that the spatial information that comprises the mark (i.e. the relative locations of different parts of the mark) is substantially unchanged in the image. An alternative way of understanding the term translational replica is that movement of the substrate mark in a particular direction will cause the image of the substrate mark to move in the same direction.

The translational image is thus not inverted and not a mirror image. Alternatively the image could be inverted twice (or any even number of times) such that the final image is not a mirror image.

An embodiment as described herein may be implemented such that the rotation of the image of the substrate mark is equal to the rotation of the substrate. A potential advantage of such an implementation is to avoid problems encountered during fine alignment.

For simplicity the translational replica image may be in the vicinity of the substrate. For example, the image of the substrate mark may be preferably provided by projecting an image of the substrate mark through front to back side alignment optics. The front to back side alignment optics typically do not have a mirroring effect.

In some implementations the image of the substrate mark is a translational replica of the substrate mark when the substrate mark is on the back side of the substrate, such that it will be a mirror image of the substrate mark when the substrate is arranged such that the substrate mark is on the front side of the substrate. It is possible that the alignment system cannot necessarily align to both a mark and the mirror image of the mark. There may therefore be a second substrate mark on the substrate which is a mirror image of the first substrate mark, with a displacement between the first substrate mark and the second substrate mark being known. The second substrate mark can be used to detect the location of the substrate when the substrate is arranged such that it is on the front side of the substrate, and the first substrate mark is used to detect the location of the substrate when the substrate is arranged such that it is on the back side of the substrate. It may be desirable to provide the first substrate mark and second substrate mark on the same side of the substrate. Alternatively, or additionally, the first substrate may have mirror symmetry such that, for example, it may be detected when it is on both the front or back side of the substrate.

It may be desirable for the optics to project the translation replica image in the vicinity of the substrate. The lithographic apparatus preferably also comprises an alignment system for detecting alignment between a reference mark and the translational replica of the substrate mark using an alignment beam of radiation.

Figure 4A:
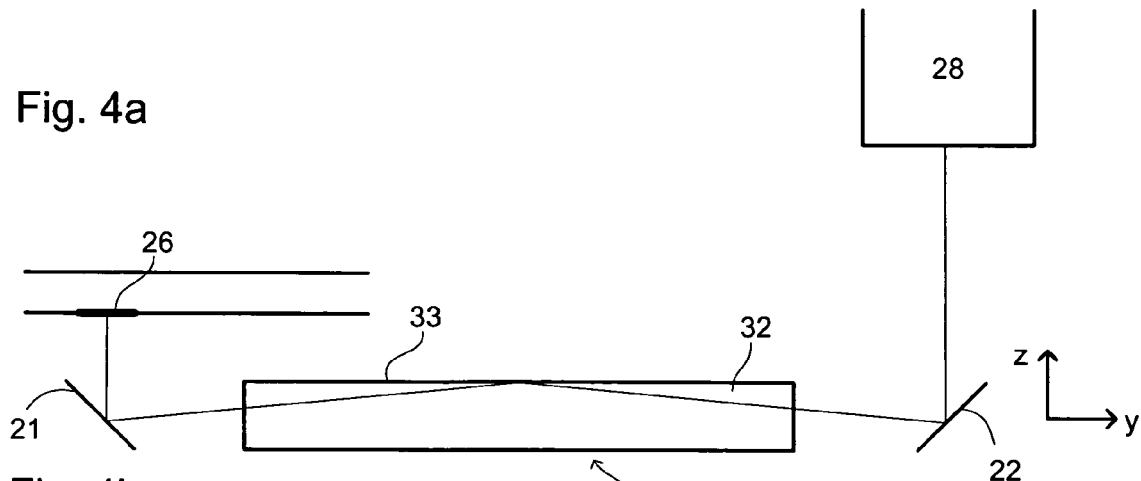
FIG. 4a depicts a second embodiment shown in the YX plane.
Figure 4B:
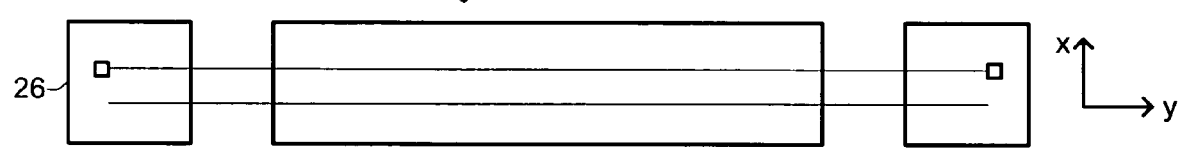
FIG. 4b depicts the second embodiment shown in the XY plane.

Another embodiment is the same as described above except in the aspects detailed below and shown in FIG. 4. The arrangement shown in FIG. 4 does not form an image of the substrate mark 26, but instead relies upon the alignment system 28 having sufficient focus depth that it can detect the substrate mark via an optical system 31. The optical system 31 comprises mirrors 21, 22 which correspond to those in the embodiment described above, and a glass rod 32 which is provided with a silvered uppermost surface 33. In this example, the glass rod is rectangular in cross-section.

Since no lenses are present in this embodiment, the optical system does not cause mirroring about the Y axis. However, the mirrors 21, 22 cause mirroring about the X axis. This mirroring is reversed by the silvered uppermost surface 33 of the glass rod 32, which acts as an additional mirror. This allows the alignment system to detect the substrate mark 26 with an unchanged orientation. In other words, the net mirroring effect of the optical system 31 is zero.

It will be appreciated that it may not be necessary to provide the glass rod 32 with a silvered uppermost surface, as instead total internal reflection from the boundary between the glass rod 32 and its surroundings could be used. In an alternative configuration the glass rod 32 may be replaced with an appropriately placed mirror (not shown).

The optics may comprise a reflecting prism with a reflecting surface parallel to the overall direction of the alignment beam and perpendicular to the substrate table. In one implementation, a reflecting prism is added to a conventional front to back side alignment optics. Thus the reflecting prism is often used in conjunction with a mirroring imaging system. In another implementation, an additional mirror is introduced into the optics. The mirror is preferably parallel to the substrate table. Such an arrangement may be used in particular in conjunction with a non-mirroring imaging system.

Figure 5:
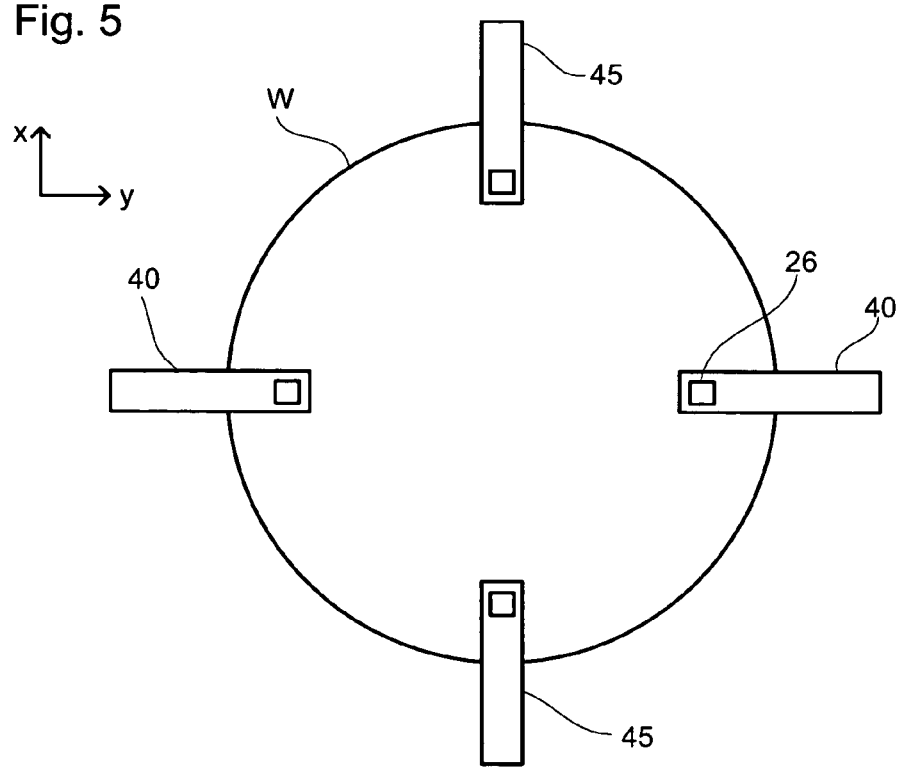
FIG. 5 depicts a third embodiment.

In a further embodiment, there are additional front to back side alignment optic branches perpendicular to the first front to back side alignment optic branches as shown in FIG. 5. In this embodiment conventional front to back side alignment optics may be used i.e. without the additional prism 25 or mirror 32 described in the embodiments above. The front to back side alignment optics 45 with a longitudinal axis in the y direction give an accurate measurement of the position of the substrate in the y direction but may have an error in the x direction due to inaccuracies in the optical axis position. The front to back side alignment optics 40 with a longitudinal axis in the x direction give an accurate measurement of the position of the substrate in the x direction but may have an error in the y direction. By combining the accurate location in the x direction and the accurate location in the y direction the exact location of the substrate can be calculated.

Although the example depicted in FIG. 5 has four front to back side optical branches, in some applications it may be sufficient to provide fewer branches (e.g. two: one with a longitudinal axis in the x direction and one with a longitudinal axis in the y direction).

While specific embodiments have been described above, it will be appreciated that the invention may be practiced otherwise than as described. In addition, embodiments also include computer programs (e.g. one or more sets or sequences of instructions) to control a lithographic apparatus to perform a method as described herein, and storage media (e.g. disks, semiconductor memory) storing one or more such programs in machine-readable form. The description is not intended to limit the invention.

What is claimed is:

1. An alignment method comprising:
   arranging a substrate in a first orientation such that a mark on the substrate is on the back side of the substrate;
   while the substrate is in the first orientation, forming an image of the substrate mark; and
   detecting an alignment between a reference mark and said image using an alignment beam,
   wherein said image is a translational replica of said substrate mark.

2. The alignment method according to claim 1, wherein said image is in the vicinity of said substrate.

3. The alignment method according to claim 1, wherein said forming an image includes projecting the image through front to back side alignment optics.

4. The alignment method according to claim 1, wherein the substrate includes a second substrate mark, said second mark being a mirror image of said first mark.

5. The alignment method according to claim 4, wherein said second substrate mark is on the same side of the substrate as said first substrate mark.

6. The alignment method according to claim 4, said method comprising arranging the substrate in a second orientation such that said second substrate mark is on the front side of said substrate and aligning said substrate while in the second orientation using said second substrate mark.

7. The alignment method according to claim 1, wherein said substrate mark has mirror symmetry.

8. The alignment method according to claim 1, wherein in said first orientation a radiation-sensitive layer is on a side of the substrate opposite the back side.

9. The alignment method according to claim 1, wherein said translational replica is not inverted.

10. The alignment method according to claim 1, wherein the reference mark is provided on a reticle.

11. A device manufacturing method comprising:
    arranging a substrate in a first orientation such that a mark on the substrate is on the back side of the substrate;
    while the substrate is in the first orientation, forming an image of the substrate mark;
    detecting an alignment between a reference mark and said image using an alignment beam; and
    subsequent to said detecting, using patterning structure to impart a beam of radiation with a pattern in its cross section and projecting the patterned beam onto a target portion of the substrate,
    wherein said image is a translational replica of said substrate mark.

12. An alignment tool comprising:
    a substrate table configured to hold a substrate having a substrate mark;
    an alignment system configured to detect alignment between a reference mark and an image of said substrate mark when said substrate mark is on the back side of said substrate using an alignment beam of radiation; and
    optics configured to project a translational replica of said substrate mark arranged on the back side of said substrate to form said image.

13. The alignment tool according to claim 12, wherein said optics is configured to project said translational replica image in the vicinity of said substrate.

14. The alignment tool according to claim 12, wherein said optics comprises a reflecting prism.

15. The alignment tool according to claim 14, wherein said optics comprises a mirroring imaging system.

16. The alignment tool according to claim 12, wherein said optics comprises a mirror.

17. The alignment tool according to claim 16, wherein said optics comprises a non-mirroring imaging system.

18. A lithographic apparatus comprising:
    an illumination system configured to provide a beam of radiation;
    a support structure configured to support a patterning structure, the patterning structure serving to impart the beam of radiation with a pattern in its cross-section;
    a substrate table configured to hold a substrate having a substrate mark;
    a projection system configured to project the patterned beam onto a target portion of the substrate; and
    optics configured to project a translational replica of said substrate mark when said substrate mark is arranged on the back side of said substrate.

19. The lithographic apparatus according to claim 18, said apparatus comprising an alignment system configured to detect alignment between a reference mark and said translational replica of said substrate mark using an alignment beam of radiation.

20. An alignment tool comprising:
    a substrate table configured to hold a substrate having a substrate mark;
    an alignment system configured to detect alignment between a reference mark and a substrate mark when said substrate mark is on the back side of said substrate, using an alignment beam of radiation; and
    an optical system configured to allow optical communication between said alignment system and said substrate mark,
    wherein an image of said substrate mark is a translational replica of said substrate mark and as received by the alignment system has substantially the same orientation as said substrate mark.

21. The alignment tool according to claim 20, wherein said optical system has a net mirroring effect of substantially zero.

22. The alignment tool according to claim 20, wherein the substrate table is configured to support the substrate at the back side.

23. An alignment tool comprising:
    a substrate table configured to hold a substrate having a substrate mark;
    an alignment system configured to detect alignment between a reference mark and an image of said substrate mark when said substrate mark is on the back side of said substrate, using an alignment beam of radiation; and
    optics configured to project said substrate mark arranged on the back side of said substrate to form said image, said optics having a net mirroring effect of zero, such that said alignment system detects said image of said substrate mark with an unchanged orientation relative to said substrate mark,
    wherein said image of said substrate mark is a translational replica of said substrate mark.

* * * * *